(12) United States Patent
Ayoub et al.

(10) Patent No.: US 8,563,434 B2
(45) Date of Patent: Oct. 22, 2013

(54) SEMICONDUCTOR DEVICE CONTACTS

(75) Inventors: Mohamed Ayoub, Durham (GB); Fabrice Dierre, Granville (FR)

(73) Assignee: Kromek Limited, Durham (GB)

( * ) Notice: Subject to any disclaimer, the term of this patent is extended or adjusted under 35 U.S.C. 154(b) by 182 days.

(21) Appl. No.: 13/258,849

(22) PCT Filed: May 18, 2010

(86) PCT No.: PCT/GB2010/050804
§ 371 (c)(1),
(2), (4) Date: Oct. 18, 2011

(87) PCT Pub. No.: WO2010/133869
PCT Pub. Date: Nov. 25, 2010

(65) Prior Publication Data
US 2012/0045868 A1  Feb. 23, 2012

(30) Foreign Application Priority Data
May 19, 2009  (GB) .................................. 0908583.8

(51) Int. Cl.
*H01L 21/44* (2006.01)
(52) U.S. Cl.
USPC ..... 438/678; 438/102; 438/685; 257/E21.075
(58) Field of Classification Search
USPC ................... 438/102, 678, 685; 257/E21.075
See application file for complete search history.

(56) References Cited

U.S. PATENT DOCUMENTS

| 5,731,634 | A | 3/1998 | Matsuo et al. |
| 6,455,422 | B1 * | 9/2002 | Ngo et al. ..................... 438/660 |
| 6,607,981 | B1 * | 8/2003 | Takahashi et al. ............ 438/678 |
| 2004/0005753 | A1 * | 1/2004 | Kostamo et al. .............. 438/222 |
| 2004/0129994 | A1 | 7/2004 | Moriyama et al. |

FOREIGN PATENT DOCUMENTS

| EP | 1019568 A1 | 7/2000 |
| JP | 5145068 A | 6/1993 |
| JP | 7321111 A | 12/1995 |
| WO | WO-99/10571 A1 | 3/1999 |

OTHER PUBLICATIONS

Gotz, Andreas, "International Search Report", for PCT/GB2010/050804, as mailed Oct. 1, 2010, 4 pages.
Ayoub, M., et al., "New approach to deposition of W and Mo on CdTe by the electroless method" 2009 IEEE Nuclear Science Symposium and Medical Imaging Conference (NSS/MIC 2009), IEEE, Orlando, FL, USA, Oct. 24, 2009, pp. 1797-1799.

* cited by examiner

*Primary Examiner* — Robert Huber
(74) *Attorney, Agent, or Firm* — Winstead PC

(57) ABSTRACT

A method of fabrication of electrical contact structures on a semiconductor material includes depositing an oxide of a desired contact material by a chemical electroless process on a face of the semiconductor material and reducing the oxide via a chemical electroless process to produce a contact of the desired contact material. A method of fabrication of a semiconductor device incorporating such electrical contact structures and a semiconductor device incorporating such electrical contact structures are also described.

24 Claims, 3 Drawing Sheets

SEMICONDUCTOR DEVICE CONTACTS

The invention relates to a method of fabrication of electrical contact structures for a semiconductor, to a method of fabrication of a semiconductor device incorporating such electrical contact structures, and to a semiconductor device incorporating such electrical contact structures. The invention in particular relates to a semiconductor device for high energy physics applications, such as a detector for high energy radiation. The invention in particular relates to a semiconductor device comprising a large direct band gap semiconductor material, for example a group II-VI semiconductor material such as cadmium telluride (CdTe), cadmium zinc telluride (CZT), cadmium manganese telluride (CMT) or the like, for example formed as a bulk single crystal.

Cadmium telluride and similar semiconductor materials have found application in recent years in a variety of high energy physics applications, such high energy radiation detection. In particular their ability to resolve high energy electromagnetic radiation such as x-rays or gamma rays spectroscopically has been utilised. This may be especially the case where the material is fabricated as a bulk scale single crystal, which has become a more practical proposition as a result of the development of bulk vapour deposition techniques, for example multi-tube physical vapour phase transport methods, such as that disclosed in EP-B-1019568.

The performance of the devices based on such materials depends both on the electrical properties of the semiconductor and on the qualities of the deposited contacts and more precisely on the interface formed between contact/semiconductor. Indeed, the contact material can inherently affect the overall device behaviour, as can the choice of the deposition method since this can have an important influence on the composition of the interfacial layer formed between contact/semiconductor. Current practical methods for deposition of contacts include evaporation, sputtering, electrolytic and electroless chemical deposition.

To make a good nuclear detector in CdTe, it is important to have two types of contacts: one is injecting type on one face of the detector and the other is blocking type on the other face. The choice of an optimized couple injecting/blocking assures to limit the leakage current and allows the application of a high voltage into the device, without having a polarisation effect.

At the present time, the deposition of contact done by a physical deposition method (e.g. sputtering) is following by an annealing process to diffuse the metal in the CdTe and, like this, to have a good contact between the two elements.

Deposition by a chemical electroless process is often preferred as a method simpler and quicker to carry out than the physical deposition and as a method that creates a stronger chemical bonding between the contacts and the material CdTe without necessity to anneal. At the present time three standard types of contacts, gold, platinum and palladium contacts, are typically produced by this method. The range of practical chemical electroless contacts is thus generally limited.

According to the invention in a first aspect a method of fabrication of contacts on a semiconductor material comprises the steps of:
depositing an oxide of a desired contact material by a chemical electroless process on a face of the semiconductor material; and
reducing the oxide via a chemical electroless process to produce a contact of the desired material.

According to the invention in a further aspect, a method of fabrication of a semiconductor device comprises:
providing a semiconductor structure having at least a first layer of semiconductor material on which it is desired to create an electrical contact;
depositing an oxide of a desired contact material by a chemical electroless process on a face of the semiconductor material; and
reducing the oxide via a chemical electroless process to produce a contact of the desired contact material.

According to the invention in a further aspect, a semiconductor device comprises at least a first layer of semiconductor material having deposited thereon a contact structure deposited via a two stage chemical electroless process comprising first the deposition of an oxide of the desired contact material and subsequently the reduction of the oxide of the contact material to produce a conducting contact.

Deposition is via a two-stage chemical electroless process. The use of the chemical electroless method may present a number of advantages in comparison with the other methods of deposition such as evaporation, sputtering; including one or more of:
  Easy and fast deposition (few minutes).
  Avoids sources of contamination and reduces the formation of oxide layers before contact deposition.
  Allows the deposition of injecting contacts, which are able to solve the problem of polarisation.
  Low cost.

The two stage process is found to increase significantly the range of contact materials available for use. In particular, it may become possible to deposit contact materials having a work function substantially different from the semiconductor material and of Au, Pt or Pd. Contact materials must comprise suitable electrical conductors in the reduced state. Subject to this proviso they may be metal or non-metallic semiconductor, pure element or alloy.

The step of depositing an oxide of a desired contact material by a chemical electroless process on a face of the semiconductor material conveniently comprises applying to the semiconductor, and in particular immersing the semiconductor in, a solution from which a relatively insoluble oxide of a desired contact material is deposited onto the semiconductor material. Such a solution thus comprises a deposition solution. Preferably the relatively insoluble oxide layer is formed chemically at the semiconductor surface by oxidation of the semiconductor material at the surface. Preferably the step of depositing an oxide of a desired contact material is performed in an acidic environment, for example by applying to and for example immersing in an acidic solution. Preferably the deposition solution is acidic. Particularly preferably the solution includes oxoacid anions of the desired contact material. For example the deposition solution comprises a solution of a metal oxoacid of a desired metal contact material.

The step of reducing the resultant oxide via a chemical electroless process to produce a contact of the desired contact material conveniently comprises applying to the semiconductor, and in particular immersing the semiconductor in, a reducing agent. Preferably the step of depositing an oxide of a desired contact material is performed in a basic environment, for example by applying to and for example immersing in a basic solution. A convenient reducing agent might include ammonia solution.

Thus in the preferred case the method comprises dipping the semiconductor successively into a first, deposition solution by means of which an oxide layer is formed via a chemical electroless process and for example oxidatively at the semiconductor surface and into a second, reducing solution by means of which the oxide layer is reduced via a chemical electroless process to a layer of desired contact material.

The semiconductor material onto which the contact is deposited is preferably a material adapted for high energy physics applications, such as a material able to act as a detector for high energy radiation, and for example high energy electromagnetic radiation such as x-rays or gamma rays or subatomic particle radiation. The resultant device comprises at least one layer of such material and is thus a device adapted for high energy physics applications, and a detector for high energy radiation such as x-rays or gamma rays or subatomic particle radiation.

In a preferred embodiment the semiconductor device is a detector device adapted to exhibit a spectroscopically variable response to incident radiation across at least a substantial part of the radiation spectrum in use. In particular the semiconductor material preferably exhibits inherently as a direct material property a direct variable electrical and for example photoelectric response to different parts of the radiation spectrum in use. In a preferred embodiment the semiconductor material is formed as a bulk crystal, and for example as a bulk single crystal (where bulk crystal in this context indicates a thickness of at least 500 µm, and preferably of at least 1 mm).

In a preferred embodiment the semiconductor material may be selected from Group II-VI semiconductors and in particular may be selected from cadmium telluride, cadmium zinc telluride (CZT), cadmium manganese telluride (CMT), and alloys thereof, and for example comprise crystalline $Cd_{1-(a+b)}Mn_aZn_bTe$ where $a+b<1$ and a and/or b may be zero.

Conventionally, contacts for such materials applied by a chemical electroless process have typically been limited to the three standard types of contacts, gold, platinum and palladium. The method of the invention makes a greater range of contact materials more practical.

In particular, the invention makes it possible to select as a contact material a material to form an ohmic contact, for example a material having a high work function offering potentially better ohmic behaviour than Au, Pt or Pd. Examples of such materials include materials selected from the group comprising Ge, W, Mo, Cu, Ir, Rh, Ru, Se, Sn, Os, Re, Ni, Sb and alloys and combinations thereof. Alternatively, the invention makes it possible to select as a contact material a material to form a Shottky diode/blocking contact. Examples of such materials include materials selected from the group comprising Bi, In, Tl and alloys and combinations thereof.

Materials which form stable relatively insoluble oxide structures during the first deposition step are likely to be preferred. Transition metals and in particular those with a larger number of valence electrons may be preferred. Metals which form oxoanions soluble in aqueous acid conditions with a valency of at least five, and more preferably at least six, which are capable of being reduced by electroless reaction with the surface of the semiconductor material to form a stable relatively insoluble oxide layer may be preferred. Tungsten and molybdenum are particularly suited to the method of the invention. In particular, it appears that W and Mo are particularly interesting elements because both have a higher work function than CdTe and a rich number of valence electrons.

The invention will now be described by way of example only with reference to examples of deposition of tungsten and molybdenum contacts, and with reference to FIGS. 1 to 5 in which.

EXAMPLES

1. Tungsten (W)

The tungsten contacts are carried out by dipping the CdTe into two baths. The first bath comprises an acid solution from which insoluble oxides of tungsten may be deposited at the CdTe semiconductor surface. The second bath reduces these oxides to tungsten metal.

1. 1. Oxidation

The first bath has the purpose to create a strong chemical bonding between CdTe and W through a layer of tungsten oxide. This bath is a mixture of tungstic acid ($H_2WO_4$) in main component. Under the acidic solution environment, the tungsten compound is under the form $WO_4^{2-}$ ions in the solution. These ions react with CdTe at the surface to form a layer of insoluble oxides $WO_2$ and $W_2O_5$ on the surface of the semiconductor, as described by these equations:

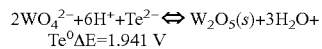

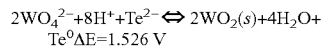

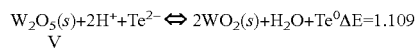

Figure 1:
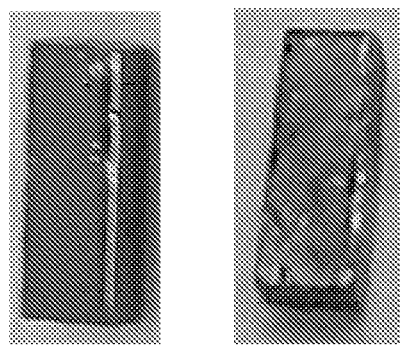
FIG. 1 shows a CdTe device before and after a first bath in a process to apply a W contact.

After a few seconds of dipping, the detector is covered with a brown layer ($WO_2$) with blue reflections ($W_2O_5$) like shown on the FIG. 1.

1. 2. Reduction

The second bath is an ammonia solution; it has the purpose to reduce the oxide layers to tungsten metal:

Figure 2:
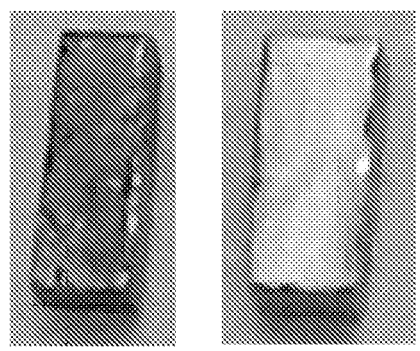
FIG. 2 shows a CdTe device before and after a second bath in a process to apply a W contact.

After few minutes of dipping, the coating of oxides is reduced in tungsten as shown on the FIG. 2.

2. Molybdenum (Mo)

Like the tungsten contacts, molybdenum contacts are created by dipping CdTe semiconductor material into two baths.

2. 1. Oxidation

In like manner to the example given for tungsten contacts, the first bath creates an oxide layer at the surface of CdTe. This bath is a mixture of molybdic acid ($H_2MoO_4$) mainly. The ions $HMoO_4^-$ and $MoO_4^{2-}$ are in the majority in the solution. They react with CdTe to form a layer of $MoO_2$ and $Mo_2O_5$, as describe by these equations:

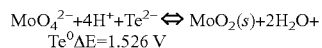

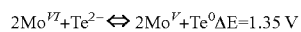

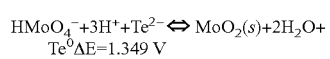

Like tungsten contacts, the choice of reactants (other than molybdic acid) in the solution is critical to stabilize one or two forms of oxides.

After few minutes of dipping, the detector is covered with a gray layer.

2. 2. Reduction

Figure 3:
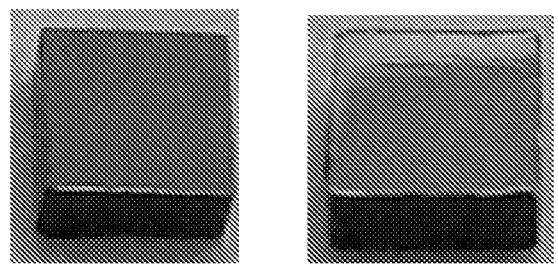
FIG. 3 shows a CdTe device before and after application of a Mo contact.

After a few minutes of dipping in ammonia solution, the coating of oxides is reduced to molybdenum as shown on the FIG. 3.

Figure 4:
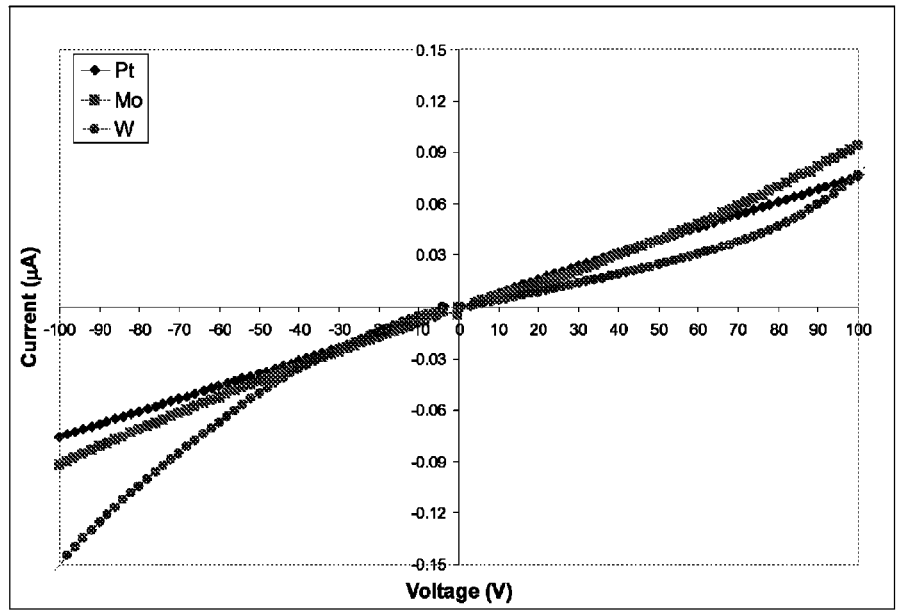
FIG. 4 shows the current-voltage data for a CdTe device with a Pt, W and Mo contact compared.
Figure 5:
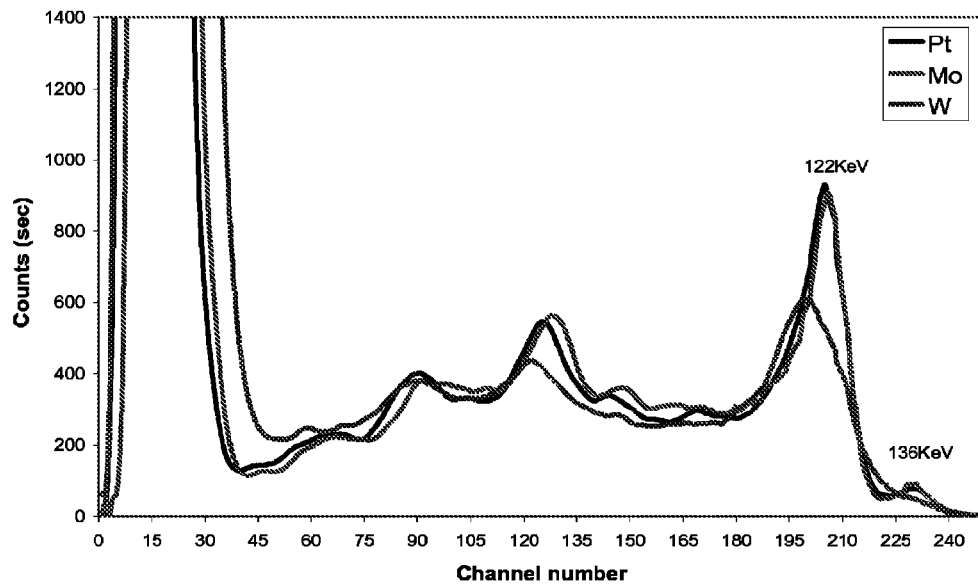
FIG. 5 shows $^{57}Co$ Gamma ray spectrum for a CdTe device with a Pt, W and Pt contact compared.

Detector characterisation data is shown in FIGS. 4 and 5 and in the tables below for tungsten and molybdenum and platinum contacts.

TABLE 1

Data for FIGS. 4 and 5 example

| | Size (mm) | Voltage (V) | I (nA) | P/V | FWHM (KeV) | Efficiency |
|---|---|---|---|---|---|---|
| Pt/Pt contact | 4 × 4 × 2 | 100 | 70 | 3.5 | 8.1 | 202 |
| Mo/Mo contact | 4 × 4 × 2 | 100 | 90 | 3.5 | 8.2 | 206 |
| W/W contact | 4 × 4 × 2 | 100 | 100 | 2.4 | 14 | 198 |

Figure 6:
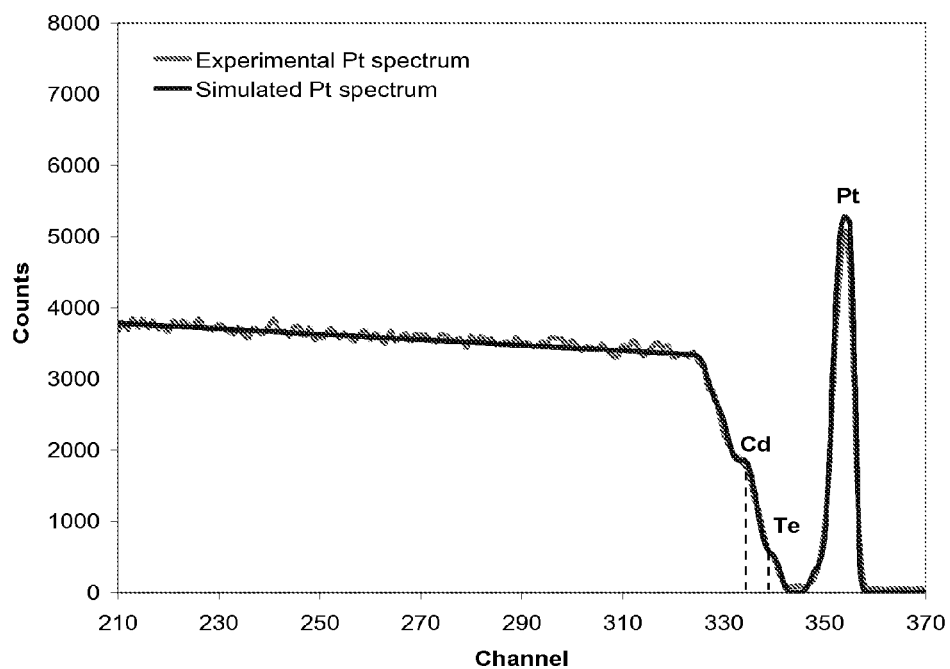
FIG. 6 shows the RBS data for a CdTe device with a Pt contact.
Figure 7:
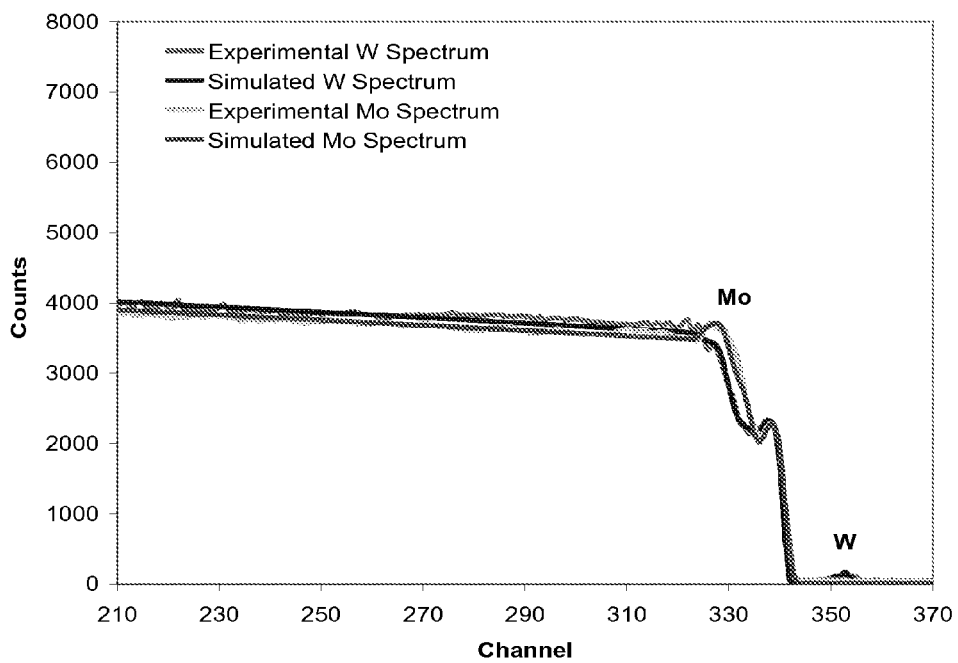
FIG. 7 shows the RBS data for a CdTe device with a W and Mo contact compared.

Rutherford Back Scattering (RBS) spectrums were shown on the FIGS. 6 and 7 for Pt, Mo and W contacts. The RBS peaks for these three contacts are well visible on the same figures. The measured thicknesses of Pt, Mo and W contact layers are respectively 250 Å, 60 Å and ~10 Å.

It will be appreciated that tungsten and molybdenum are described as suitable preferred example contacts and CdTe as a suitable preferred example semiconductor, but that the principles of the two stage electroless contact deposition described in accordance with the invention may be appropriate to a range of semiconductor materials and to the deposition of other contact materials exhibiting similar chemistry.

The invention claimed is:

1. A method of fabrication of contacts on a semiconductor material comprising the steps of:
    depositing an oxide of a desired contact material by a chemical electroless process on a face of the semiconductor material;
    reducing the oxide via a chemical electroless process to produce a contact of the desired contact material;
    wherein the step of depositing comprises applying a deposition solution from which a relatively insoluble oxide of a desired contact material is deposited onto the semiconductor material; and
    wherein the deposition solution is selected such that the relatively insoluble oxide is formed chemically at the face by oxidation of the semiconductor material at the face.

2. A method in accordance with claim 1 wherein the step of depositing comprises immersing the semiconductor in the deposition solution.

3. A method in accordance with claim 1 wherein the deposition solution is acidic.

4. A method of fabrication of contacts on a semiconductor material comprising the steps of:
    depositing an oxide of a desired contact material by a chemical electroless process on a face of the semiconductor material;
    reducing the oxide via a chemical electroless process to produce a contact of the desired contact material;
    wherein the step of depositing comprises applying a deposition solution from which a relatively insoluble oxide of a desired contact material is deposited onto the semiconductor material; and
    wherein the deposition solution includes oxoacid anions of the desired contact material.

5. A method in accordance with claim 4 wherein the deposition solution comprises a metal oxoacid of a desired metal contact material.

6. A method in accordance with claim 1 wherein the step of reducing the oxide via a chemical electroless process comprises applying a reducing agent to the semiconductor.

7. A method in accordance with claim 6 wherein the step of reducing the oxide via a chemical electroless process comprises immersing the semiconductor in a reducing agent.

8. A method in accordance with claim 6 wherein the step of reducing the oxide is performed in a basic environment.

9. A method in accordance with claim 6 wherein the reducing agent comprises ammonia solution.

10. A method in accordance with claim 1 wherein the semiconductor material onto which the contact is deposited is a material adapted for high energy physics applications.

11. A method in accordance with claim 10 wherein the semiconductor material is a material able to act as a detector for high energy radiation.

12. A method in accordance with claim 1 wherein the semiconductor material is formed as a bulk single crystal.

13. A method in accordance with claim 1 wherein the semiconductor material is selected from cadmium telluride, cadmium zinc telluride (CZT), cadmium manganese telluride (CMT), and alloys thereof.

14. A method in accordance with claim 13 wherein the semiconductor material comprises crystalline $Cd_{1-(a+b)}Mn_aZn_bTe$ where $a+b<1$ and at least one of a and b may be zero.

15. A method in accordance with claim 1 wherein the contact material is a material having a higher work function than Au, Pt or Pd.

16. A method in accordance with claim 1 wherein the contact material is selected to form an ohmic contact.

17. A method in accordance with claim 1 wherein the contact material is selected from the group consisting of Ge, W, Mo, Cu, Ir, Rh, Ru, Se, Sn, Os, Re, Ni, Sb and alloys and combinations thereof.

18. A method in accordance with claim 17 wherein the contact material is selected from tungsten and molybdenum.

19. A method in accordance with claim 1 wherein the contact material is selected to form a Shottky diode or blocking contact.

20. A method in accordance with claim 19 wherein the contact material is selected from the group consisting of Bi, In, Tl and alloys and combinations thereof.

21. A method of fabrication of a semiconductor device comprising:
    providing a semiconductor structure having at least a first layer of semiconductor material on which it is desired to create an electrical contact;
    depositing an oxide of a desired contact material by a chemical electroless process on a face of the semiconductor material; and
    reducing the oxide via a chemical electroless process to produce a contact of the desired contact material via the method of claim 1.

22. A semiconductor device comprising at least a first layer of semiconductor material having deposited thereon a contact structure deposited via a two stage chemical electroless process in accordance with claim 1.

23. A method in accordance with claim 11 wherein the high energy radiation is high energy electromagnetic radiation.

24. A method in accordance with claim 23 wherein the high energy electromagnetic radiation is selected from the group consisting of x-rays, gamma rays, and subatomic particle radiation.

\* \* \* \* \*